(12) United States Patent
Kurtas et al.

(10) Patent No.: US 6,976,203 B2
(45) Date of Patent: Dec. 13, 2005

(54) TURBO DECODER ARCHITECTURE WITH MINI-TRELLIS SISO

(75) Inventors: Erozan Mehmet Kurtas, Pittsburgh, PA (US); Jongseung Park, Pittsburgh, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 135 days.

(21) Appl. No.: 10/633,791

(22) Filed: Aug. 4, 2003

(65) Prior Publication Data

US 2004/0064777 A1 Apr. 1, 2004

Related U.S. Application Data

(60) Provisional application No. 60/414,774, filed on Sep. 30, 2002.

(51) Int. Cl.[7] .................. H03M 13/29; H03M 13/45
(52) U.S. Cl. .................. 714/755; 714/780; 714/792
(58) Field of Search ............... 714/755, 780, 714/792

(56) References Cited

U.S. PATENT DOCUMENTS

| | | | | |
|---|---|---|---|---|
| 5,812,601 | A | 9/1998 | Schramm | 375/262 |
| 6,112,326 | A | 8/2000 | Khayrallah | |
| 6,556,633 | B2 * | 4/2003 | Brianti et al. | 375/341 |

FOREIGN PATENT DOCUMENTS

EP        1 137 002 A1    9/2001

OTHER PUBLICATIONS

Hoeher, P., et al., "Iterative Decoding/Demodulation of Coded DPSK Systems", IEEE GLOBECOM 98, Nov. 1998, pp. 598–603.*

Souvignier, T., et al., "Turbo Decoding for PR4: Parallel Versus Serial Concatenation", IEEE ICC 99, Jun. 1999, pp. 1638–1642.*

May, T., et al., "Turbo Decoding of Convolutional Codes in Differentially Modulated OFDM Transmission Systems", IEEE 49th Vehicular Technology Conference, Jul. 1999, pp. 1891–1895.*

Oberg, M., et al., "Parity Check Codes for Partial Response Channels", IEEE GLOBECOM 99, Dec. 199, pp. 717–722.*

Divsalar, D., et al., "Serial Concatenated Trellis Coded Modulation with Rate–1 Inner Code", IEEE GLOBECOM 2000, Nov. 2000, pp. 777–782.*

"Reduced Complexity In–Phase/Quadrature–Phase Turbo Equalisation Using Iterative Channel Estimation", B.L. Yeap, et al., 0–7803–7097–1/01 IEEE, 2001.

"A Soft–Input Soft–Output Maximum A Posteriori (MAP) Module to Decode Parallel and Serial Concatenated Codes", S. Benedetto, et al., *TDA Progress Report 42–127*, Nov. 15, 1996.

"Convergence Properties of Iterative Decoders Working at BIT and Symbol Level", B. Scanavino, et al. Politecnico de Torino, Torino, Italy.

(Continued)

*Primary Examiner*—Stephen M. Baker
(74) *Attorney, Agent, or Firm*—Kinney & Lange, P.A..

(57) ABSTRACT

The Turbo decoding architecture has a first soft-input soft-output (SISO) device having a complex trellis structure and a Turbo decoder loop with a second SISO device having a simpler trellis structure. Coded information from a channel is processed by the first SISO device to generate a soft-output based on the coded information. The soft-output is then processed in an iterative loop using the second SISO device. The second SISO device interacts with a decoder device to produce a value representative of the transmitted information.

20 Claims, 7 Drawing Sheets

OTHER PUBLICATIONS

"VLSI Architectures for Turbo Codes", Guido Masera, et al., *IEEE Transactions on Very Large Scale Integration (VLSI-)Systems*, vol. 7, No. 3, Sep. 1999.

"SCTCM with Inner Rate–1 Accumulate Code" (printed slide presentation), Hugo M. Tullberg and Paul H. Siegel, Signal Transmisson and Recording Group, UCLA, Jan. 30, 2002.

"Serial Concatenated Trellis Coded Modulation with Inner Rate–1 Accumulate Code", Hugo M. Tullgerg and Paul H. Siegel. 0–7803–7208–5/01 IEEE, 2001.

"On Joint Iterative Decoding of Variable–length Source Codes and Channel Codes", Ahmadreza Hedayat and Aria Nosratinia, Multimedia Communications Laboratory, Richardson, TX.

"Trellis Turbo–Codes in Flat Rayleigh Fading with Diversity", Christos Komninakis and Richard D. Wesel, 0–7803–7206–9/01 IEEE, 2001.

"A Low Latency SISO with Application to Broadband Turbo Decoding", Peter A. Beerel and Keith M. Chugg, *IEEE Journal on Selected Areas in Communications*, vol. 19, No. 5, May 2001.

"Further Results on a Reduced–Complexity, Highly Power–/Bandwidth–Efficient Coded Feher–Patented Quadrature–Phase–Shift–Keying System with Iterative Decoding", M.K. Simon and D. Divsalar, *IPN Progress Report* 42–146, Aug. 15, 2001.

"A Soft–Input Soft–Output APP Module for Iterative Decoding of Concatenated Codes", S. Benedetto, et al., *IEEE Communications Letters*, vol. 1, No. 1, Jan. 1997.

William E. Ryan, Concatenated Codes for Class IV Partial Response, IEEE Transactions On Communications, vol. 49., No. 3, Mar. 2001, pp. 445–454.

Joachim Hagenauer, Iterative Decoding of Binary Block and Convolutional Codes, IEEE Transactions On Information Theory, vol. 42, No. 2, Mar. 1996, pp. 429–445.

D. Divsalar and F. Pollara, Multiple Turbo Codes for Deep–Space Communications, TDA Progress Report 42–121, May 15, 1995, pp. 66–77.

Tom V. Souvignier, Turbo Decoding for Partial Response Channels, IEEE Transactions On Communications, vol. 48, No. 8, Aug. 2000, pp. 1297–1307.

Divsalar et al., *Serial Concatenated Trellis Coded Modulation with Rate–1 Inner Code*, Dec. 2000, pp. 777–782.

Souvignier et al., *Turbo Decoding for PR4: Parallel Versus Serial Concatenation*, Jun. 1999; pp. 1638–1642.

May et al., *Turbo Decoding of Convolutional, Codes in Differentially Modulated OFDM Transmission Systems*, Jul. 1999, pp. 1891–1895.

Öberg et al., *Parity Check Codes for Partial Response Channels*, 1999, pp. 717–722.

Hoeher et al., *Iterative Decoding/Demodulation of coded DPSK systems*, 1998, pp. 598–603.

\* cited by examiner

TURBO DECODER ARCHITECTURE WITH MINI-TRELLIS SISO

CROSS-REFERENCE TO RELATED APPLICATION

This application claims priority from provisional application Ser. No. 60/414,774, filed Sep. 30, 2002, entitled "A NEW TURBO DECODER ARCHITECTURE WITH MINI-TRELLIS SISO."

FIELD OF THE INVENTION

The present invention relates to Turbo coded communication systems. More particularly, the present invention relates to an architecture for simplifying the iterative decoding process to achieve greater speed while minimizing the impact on the bit error rate. Specifically, the present invention relates to an architecture that performs Turbo decoding using a soft-input soft-output (SISO) device having a simpler state-trellis structure inside of an iterative Turbo loop for processing data passed from a more complex state-trellis outside of the Turbo loop.

BACKGROUND OF THE INVENTION

In data communications, the use of forward error-correction codes plays a fundamental role in transmission accuracy, as well as in increasing spectrum efficiency. Shannon's law suggests that the development of error-correction techniques with increasing coding gain has a limit that arises from the channel capacity. Performances, very close to Shannon's capacity limit, have been obtained using a class of codes, which are widely referred to as "Turbo Codes".

Generally, Turbo codes are formed using conventional encoders connected either in parallel or series to produce concatenated outputs. The bit sequences passing from one encoder to the next are shifted (or permuted) by an interleaver. This process transforms low-weight codewords into high-weight codewords for the global encoder in order to achieve high coding gains.

Generally, the decoder consists of a network of interconnected de-interleavers and decoding stages, individually matched to the respective constituent codes. The decoding of the received codeword sequences is performed iteratively, using an algorithm that utilizes the a posteriori probability distributions associated to the individual codewords of the transmission sequence. The decoding stages utilize the obtained soft output information (e.g. a reliability vector, a new probability distribution) from the previous decoding stage as a reliability input in the next decoding stage. The decoding process is repeated iteratively until a satisfactory estimate of the transmitted information is achieved.

Since their introduction in 1993, Turbo codes have been successfully applied to many communication areas, especially in wireless personal communication systems, where required data-rate and bit-error-rate are relatively moderate. However, Turbo codes have not been successfully implemented in data storage systems (such as hard discs, and the like) because of the very high data-rate, very stringent bit-error-rate, and the very high complexity of the decoding system. The high complexity can be attributed to the requirement of the soft-input soft-output (SISO) device in the decoder. The complexity is exacerbated by the fact that numerous iterative decoding steps, performed by the SISO device and the Turbo decoder, are required to successfully and accurately decode the Turbo coded information.

The complexity of the SISO device is mainly determined by its trellis structure, and the trellis structure is determined by the channel structure (channel memory length, precoder memory length, etc.). Specifically, the complexity of each SISO device is determined predominantly by the number of possible states in the SISO device. For example, each bit in a binary sequence represents two possible states. A SISO device designed to receive the binary sequence should include $2^n$ states, where n is the number of bits each bit depends upon in the sequence.

The SISO device generally takes a noisy sequence of information and outputs extrinsic information, representing a probability vector associated with the noisy sequence, as well as a less noisy sequence of information. Within the trellis, essentially two symbols are assigned to each branch of the trellis (the information symbol and the coded symbol). Typically, the extrinsic information is passed through an interleaver before being passed to the next SISO in sequence, in order to make the iterative decoding more accurate by introducing weak correlation between the extrinsic information components of the SISO devices, hence each subsequent SISO processes a less correlated sequence. In each iteration, only the extrinsic information generated by each is exchanged between the soft-output decoders. After the last iteration, the final soft-output sequence is decoded at symbol-level.

Generally, the trellis structure is determined by the number of states possible within the SISO device. Thus, when the number of possible states within the SISO device is large, the SISO trellis is correspondingly large and complex. Moreover, the circuit footprint grows according to the trellis size, such that the larger the SISO trellis, the larger the area required on the circuit board to accommodate the SISO device.

It is desirable to perform iterative decoding operations faster and with less complexity, and with only a nominal sacrifice in the bit-error-rates, depending on the application. More specifically, it is desirable to have a decoder that performs the iterative decoding steps with a simpler trellis than ordinarily required by the channel size and precoder length.

BRIEF SUMMARY OF THE INVENTION

The present invention uses two or more SISO devices having different trellis structures to reduce the complexity and the circuit footprint of a turbo decoder loop, based on a factorization of a mathematical model of the precoder and the channel. Generally, a SISO device (such as BCJR algorithm or SOVA) is chosen according to its trellis structure to correspond to the precoder memory length and the transmission channel memory length. The SISO device processes a transmission and passes the bit output to a second SISO device that runs on a second trellis, which is significantly less complex than the first trellis structure. The second SISO device is used by the turbo decoder loop for iterative decoding, thereby reducing the complexity and increasing the achievable data-rate. Since the second (simpler) SISO device is located inside the turbo loop, the complexity of the whole system is reduced significantly as the number of turbo iterations increase. If the turbo loop is implemented in parallel architecture, the reduction in chip area can be very large, or if the turbo loop is implemented in serial architecture, the reduction in processing time can be very large.

DETAILED DESCRIPTION

Figure 1:
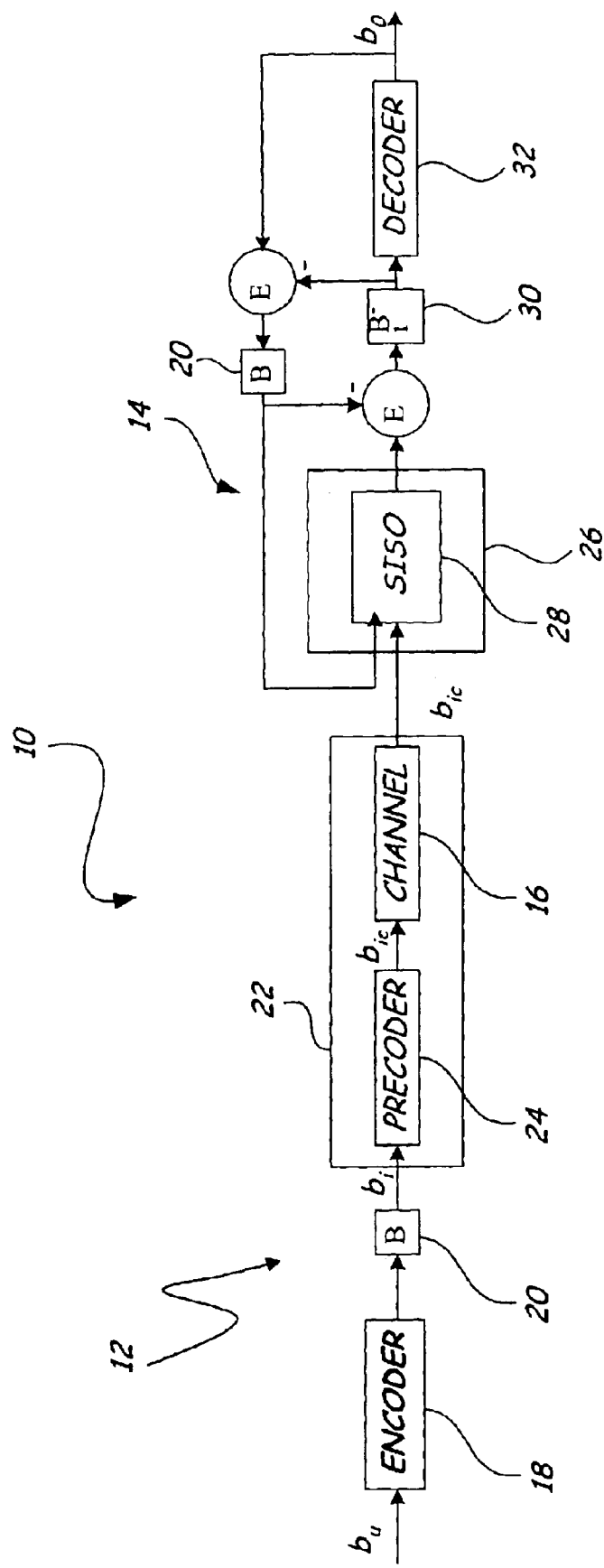
FIG. 1 is a schematic block diagram of a conventional Turbo coded communication system.

FIG. 1 shows a typical structure of a Turbo coded communication circuit 10 between two geographically separated devices, though the system is equally applicable to inter-device communications. The communication circuit 10 is formed of a closed loop between the sending and receiving device, including the communication channel. In general, the communication circuit 10 includes a turbo encoder 12, a turbo decoder 14, and a communication channel 16, which links the encoder 12 and the decoder 14. The turbo encoder 12 includes an encoder 18, an interleaver 20, and a transmission unit 22 (including a precoder 24 and the connection to the communication channel 16). The turbo decoder 14 includes a receiving unit 26 (including a SISO 28), a de-interleaver 30, and a decoder 32.

Typically, information for transmission over the communication channel 16 is serially encoded as a bit sequence that carries information (such as picture from digital camera or a text document) from the user's application. As shown, the bit sequence ($b_u$) is encoded by the encoder 18. Depending on the kind of the Turbo code used, a module 20 known as an interleaver ($\pi$) may be needed. The encoded bit sequence is shifted or interleaved by the interleaver 20. Then, the interleaved bit sequence ($b_i$) is precoded by a precoder 24. The resulting encoded and precoded sequence ($b_{ic}$) is transmitted over the communication channel 16.

Traditionally, the communication channel 16 generally refers to a two-way path for communicating voice and/or data signals. As the precoded sequence ($b_{ic}$) passes over or through the communication channel 16, the precoded sequence ($b_{ic}$) is subjected to noise and or interference from the outside world or from the communication channel 16. By the time the precoded sequence ($b_{ic}$) reaches the decoder 14, the precoded sequence ($b_{ic}$) may have been altered in some small way into an altered sequence ($b_{ic}'$).

Once the sequence ($b_{ic}'$) is received by the receiving unit 26, the goal of the Turbo decoder 14 is to decode the sequence ($b_{ic}'$) in order to recover the encoded and shifted sequence ($b_i$). Then, the Turbo decoder 14 performs Turbo decoding on the sequence ($b_i$) in order to reconstruct the original input signal ($b_u$). However, due to loss of data or data corruption during transmission, the reconstruction by the Turbo decoder 14 often requires some soft decision-making. Soft decision-making generally refers to a process in which data is evaluated using probability information relating to the data in order to generate an "educated guess" as to the accuracy of the data.

Once the receive unit 26 decodes the "precoded" signal, the role of the SISO (soft-input soft-output) device 28 is to generate soft-decisions on the bits of the sequence ($b_i'$), which is the received, noise-altered version of the transmitted Turbo encoded sequence ($b_i$). After passing through a de-interleaver 30 (represented by $\pi^{-1}$), the soft-decisions by the SISO device 28 are used by the decoder 32. After subtracting the inputs from the outputs of the decoder 32, the result is interleaved by interleaver 20 and fed back to the SISO device 28 as the a priori probabilities (or the log-ratios of the *a priori* probabilities depending on the specific implementation). After some iterations (usually between 4 and 20) of the soft-decisions between the SISO device 28 and the decoder 32, the decoder 32 renders a final decision as to the sequence ($b_0$).

As shown in FIG. 1, the iterative decoder process invokes the entire trellis of the SISO device 28 in each iteration. Thus, during the iterative turbo decoding process, if the SISO device has eight possible states, each iteration adds 8 more layers of complexity to the decoding process.

Figure 2:
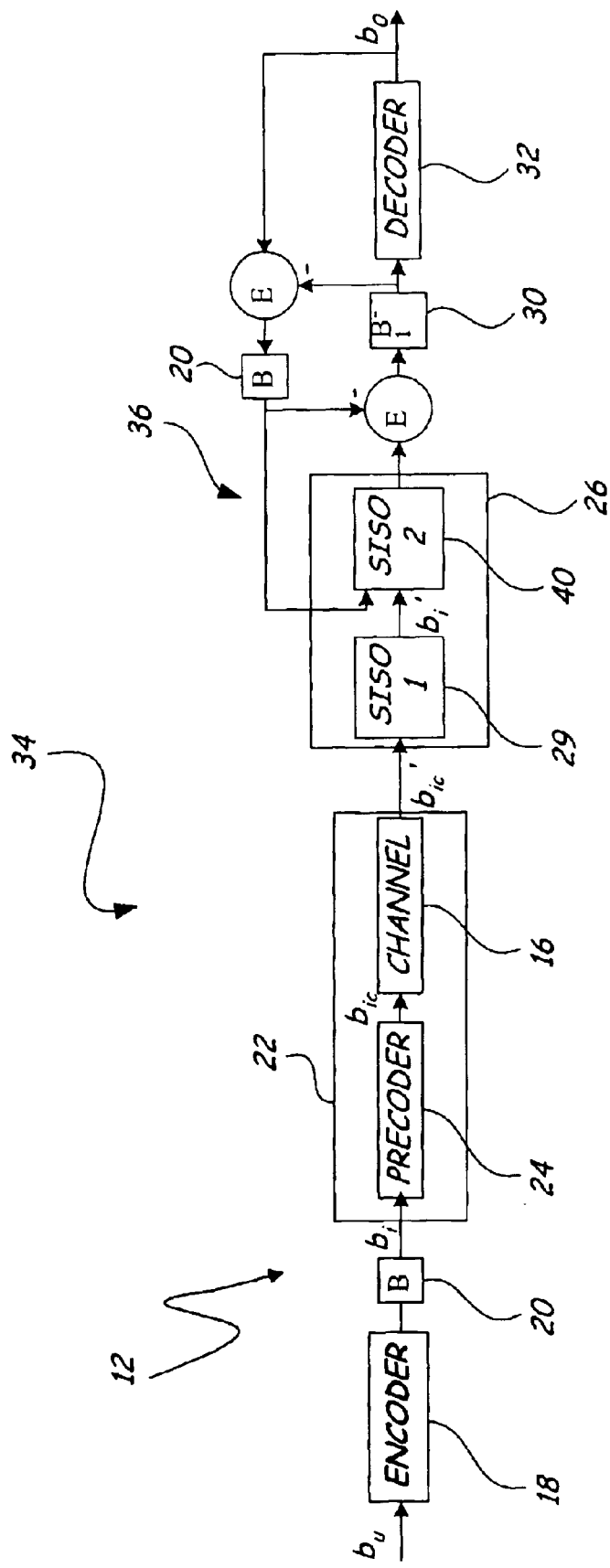
FIG. 2 is a schematic block diagram of the Turbo coded communication system of the present invention.

The Turbo decoder can be made faster and simpler, with an acceptable increase in the Bit-Error-Rate (BER) by implementing the Turbo decoder depicted in FIG. 2. Where possible, for the sake of clarity, the same reference numerals are used to indicate the same components. As with the conventional systems, the communication circuit 34 includes an encoding circuit 12, a decoding circuit 36 and a communication channel 16 connecting the encoding circuit 12 and the decoding circuit 36. The encoding circuit 18 includes an encoder 18 which encodes ($b_u$) then passes the encoded sequence through an interleaver 20, which performs a shift operation on the encoded sequence to form a shifted sequence ($b_i$). The shifted sequence ($b_i$) is then coded by the precoder 24 and transmitted over the communication channel 16.

In the embodiment shown in FIG. 2, the receive unit 38 includes two SISO devices 29, 40. Similar to the SISO device 28 of FIG. 1, the SISO device 29 makes soft-decisions about the received data sequence ($b_{ic}'$), which may have been altered by noise or interference from the communication channel 16. However, unlike SISO device 28, SISO device 29 is chosen based on a factorization of a mathematical model of the precoder/channel architecture. SISO device 40 and/or other SISO devices (not shown) in a sequence of SISO devices are chosen to represent other, simpler factors of the mathematical model. For the sake of explanation, only two SISO devices 29, 40 are shown; however, multiple SISO devices can be used, depending on the specific factorization of the mathematical model.

Generally, the SISO device 29 provides a bit sequence and a reliability vector to the SISO device 40. The SISO device 40 then uses the reliability vector and the bit sequence to make further soft-decisions about the data sequence, which are then passed through de-interleaver 30 to the decoder 32. The iterative decoding process then proceeds as discussed with respect to FIG. 1, except that the iterations proceed through SISO device 40, and do not include SISO device 29. Generally, as indicated above, SISO device 40 has a simpler state-trellis structure than SISO device 29.

Each SISO device 29, 40 has its own corresponding set of possible states. SISO device 40 has a much greater impact on the overall complexity of turbo decoder 36 than SISO device 29, because SISO device 40 is located inside the iterative loop, which connects the SISO device 40 and the Turbo decoder 32. Thus, the mathematical model is factored into at least two factors of different complexity, and the simpler factor is implemented as SISO device 40 within the turbo decoder 32.

The present invention performs turbo iteration (e.g. the exchange of soft-decisions between the SISO and the turbo decoder) only between SISO device 40 and the decoder 32, where SISO device 40 has a much simpler trellis structure than the SISO device 29. Since the iterative decoding loop is processed many times (typically 4 to 20 times) to decode a single sector of user information, the complexity reduction by having the simpler state-trellis inside of the iterative loop becomes increasingly significant as the number of iterations becomes large.

The trellis structures of SISO devices 29 and 40 can be selected to maximize the performance gains of the turbo decoder loop. Beginning with a mathematical model of the communication channel 16 with the precoder 24, for example, the communication channel 16 with precoder 24 can be described by the following equation:

$$\frac{1 + \alpha_1 D + \alpha_2 D^2 + \ldots + \alpha_n D^n}{1 \oplus \beta_1 D \oplus \beta_2 D^2 \oplus \ldots \oplus \beta_k D^k}$$

where the numerator describes the communication channel's impulse response, and the denominator describes the precoder 24. In this equation, the factor ($\beta$) takes values in the binary alphabet ($\beta \in \{1,2\}$), and the symbol ($\oplus$) refers to modulo 2 addition. The factor (D) refers to the delay operator, and the exponent refers to the number of delays in sequence. The factor ($\alpha$) is assumed to be a real number.

The complexity of the corresponding SISO device 29 is mainly determined by the memory length (n) of the communication channel 16 and the memory length (k) of the precoder 24. Since the channel's memory length (n) is much larger than the memory length (k) of the precoder 24, the number of states in the SISO device 29 (which is a dominant factor in the complexity of the SISO trellis) corresponding to the mathematical model (a) above can be described as follows:

$$2^{max(n,k)} = 2^n \quad (b)$$

Since the memory length (n) of the communication channel 16 is much larger than the memory length (k) of the precoder, the maximum of n,k is length (n).

The mathematical model of the channel 16 and the precoder 24 can be factored as follows:

$$\frac{f_1(D)f_2(D)\ldots}{g_1(D)g_2(D)\ldots} \quad (c)$$

This factorization can be expressed as follows:

$$\frac{f_1(D)f_2(D)\ldots}{g_1(D)g_2(D)} = F_1(D)F_2(D) \quad (d)$$

In forming $F_1(D)$ and $F_2(D)$ in equation (d), any possible combination of the factors from the numerator and the denominator in equation (c) will work. Generally, $F_1(D)$ determines the trellis structure of SISO device 29, and $F_2(D)$ determines the trellis structure of SISO device 40. Thus, the designer of the decoder circuit should choose F1(D) to be more complex than the subsequent SISO device 40. SISO device 29 can have any size trellis as is made necessary by the model.

The equations can be factored in multiple ways for choosing the trellis structure of the decoding circuit 36. For example, a model of a communication channel 16 and a precoder 24 having an impulse response of $(1+D-D^2-D^3)(1 \oplus D)^{-1}$ can be factored such that SISO 29 has an impulse response $(1+D-D^2-D^3)$, and the SISO device 40 can be expressed as $(1 \oplus D)^{-1}$. In this example, SISO device 29 has an eight state trellis structure (e.g. $2^3=8$). By contrast, the SISO device 40, which is positioned inside of the turbo decoding loop, has only a two-state trellis. Generally, the two state trellis is simpler than the eight-state trellis by a factor of 4. Thus, with each iteration through the turbo decoder loop, the two-state trellis reduces the complexity of the iterations significantly.

Alternatively, the channel equation could be factored into the following:

$$(1-D)(1+D)(1+D)$$

Then, factoring the equations differently, the SISO device 29 can be characterized by the following equation:

$$F_1(D) = (1-D)(1+D).$$

SISO device 40 can be characterized by the following equation:

$$F_2(D) = (1+D)(1 \oplus D)^{-1}.$$

Here, the SISO device 40 inside the turbo loop still has a two-state-trellis structure, while the SISO device 29 is now a ternary-input trellis system, since the outputs of $F_2(D)$, which are also inputs of $F_1(D)$, can be, for instance, 0, +2, or −2.

By performing soft-decisions outside the turbo loop, the SISO device 40 within the Turbo loop has fewer states about which to render soft-decisions, generally making each iteration faster and less complex. Since the turbo loop is processed many times (typically 4 to 20) to decode one sector of user information, the complexity reduction realized from this channel factorization becomes increasingly significant as the number of turbo iterations increases.

Of course, the side effect of this complexity reduction is performance loss. Specifically, since the whole constraint structure of the communication channel 16 is not used in the decoder loop, we may lose some decoding performance. However, the performance loss is in an acceptable range, giving a good compromise between complexity and performance. While the acceptable range varies according to the specific implementation and need, the decoder system of the present invention can be modified to improve performance as needed.

As shown in the following table, the resulting complexity of the SISO device 29 is significant. The table numbers illustrate the complexity of an 8-state trellis according to the mathematical model of the channel and precoder as described above.

TABLE 1

| | Trellis structure of SISO device 29. | | | | | | | |
|---|---|---|---|---|---|---|---|---|
| before/after | 0 | 1 | 2 | 3 | 4 | 5 | 6 | 7 |
| 0 | 0/0 | 1/1 | | | | | | |
| 1 | | | 1/1 | 0/2 | | | | |
| 2 | | | | | 0/−1 | 1/0 | | |
| 3 | | | | | | | 1/0 | 0/1 |
| 4 | 0/−1 | 1/0 | | | | | | |
| 5 | | | 1/0 | 0/1 | | | | |

TABLE 1-continued

Trellis structure of SISO device 29.

| before/after | 0 | 1 | 2 | 3 | 4 | 5 | 6 | 7 |
|---|---|---|---|---|---|---|---|---|
| 6 | | | | | 0/-1 | 1/-1 | | |
| 7 | | | | | | | 1/-1 | 0/0 |

If this trellis structure were within the turbo iteration loop, each iteration would necessarily involve eight possible states. In the present invention, the output of the first trellis of the first SISO device 29 is passed to the second SISO device 40. The second trellis structure is illustrated by Table 2 below.

TABLE 2

Trellis structure of SISO device 40.

| before/after | 0 | 1 |
|---|---|---|
| 0 | 0/0 | 1/1 |
| 1 | 1/0 | 0/1 |

In Tables 1 and 2, the left-most columns and top-most rows represent previous states and next state, respectively in the finite-state machine. The x/y values inside the table represent the input to the trellis (x) and the output of the trellis (y). As illustrated by Table 2, SISO device 40 has a much simpler trellis structure (two-state-trellis), as compared with the trellis structure of SISO device 29 in TABLE 1 (eight-state-trellis). Because the trellis within the turbo loop can be simplified in this manner, the turbo decoding process of the present invention is faster and less complex than the conventional decoder. Moreover, the footprint of the resulting circuit is much smaller than a circuit having an eight state trellis inside of the turbo loop.

Generally, the complexity of the trellis structure is determined by the number of possible states. While the previous example used an eight state or a ternary input trellis and a second two-state trellis, the trellis structures in the present invention can be of any combination. Depending on the specific implementation and according to the mathematical model of the precoder and channel, the present invention can be designed to have two or more SISO devices. Typically, the first SISO device has the greatest complexity, and typically only one SISO device (simpler than the first SISO device) is positioned within the turbo loop. However, depending on the factorization and the specific requirements of the decoder, the iterative loop may include more than one SISO or, alternatively, the SISO device positioned within the turbo loop may not have the simplest state-trellis structure of all of the SISO devices in the sequence.

In essence, the present invention splits the complicated trellis SISO device 28 (of FIG. 1) into simpler sub-trellises (29 and 40), having fewer states and therefore less complexity, especially for SISO 40. Thus, the invention can be applied to any intersymbol interference channel with any number of states. By factoring the intersymbol interference channel, the specific structures of the SISO devices 29, 40 can be selected to allow for a simpler SISO 40 inside the interative loop. Alternatively, more SISO devices can be used to further simplify the trellis structure of each SISO.

Figure 3:
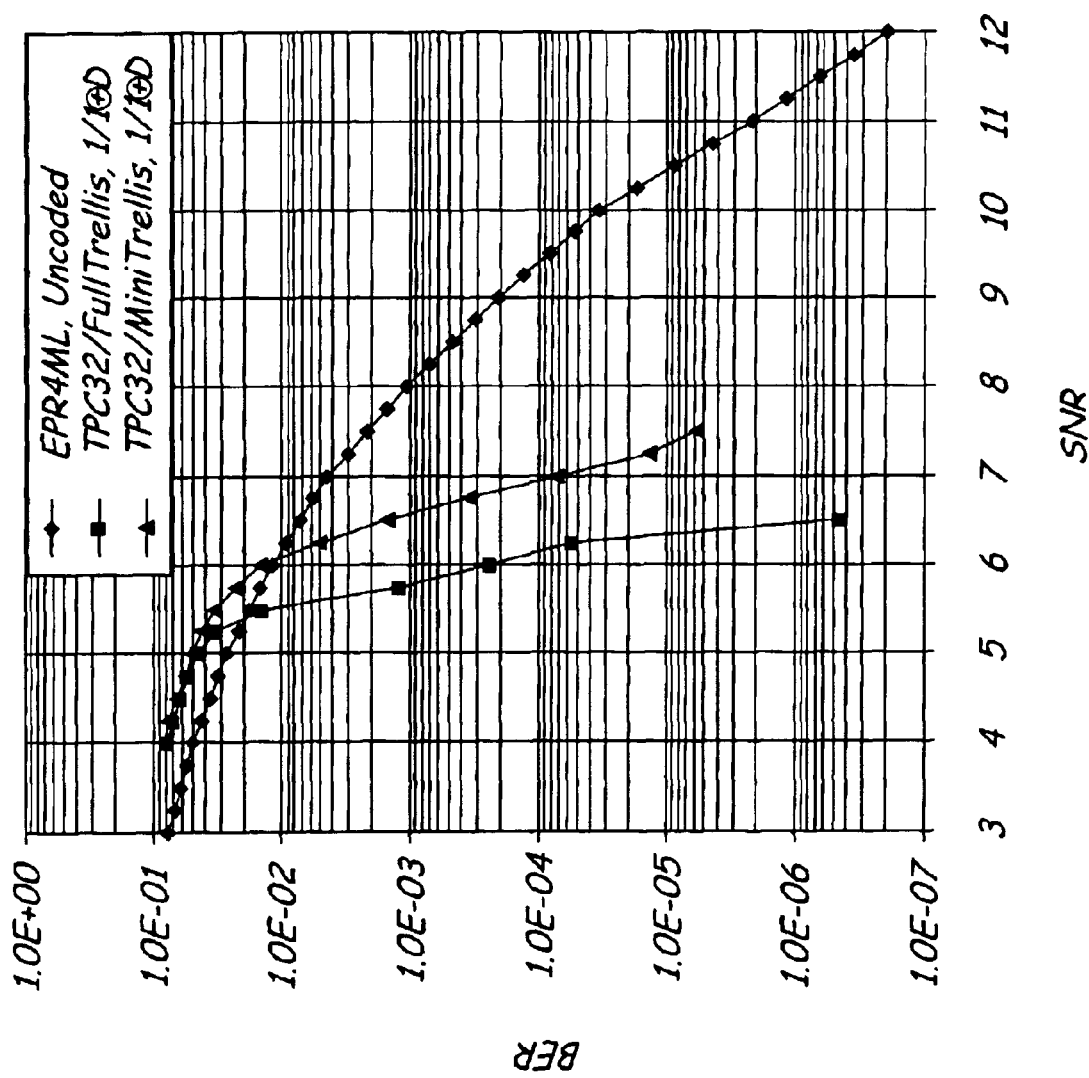
FIG. 3 is a graph of BER vs. SNR for a mini-Trellis implementation of the system of FIG. 2 having a $1/(1 \oplus D)$ factorization for the second SISO device applied to a TPC code.

FIG. 3 illustrates the Bit-Error-Rate (BER) as a function of the Signal-to-Noise ratio of the factored channel-precoder mathematical model as previously discussed. As shown, a two-SISO embodiment of the instant invention is compared against a one-SISO conventional system and a maximum-likelihood, uncoded, no iteration (i.e. hard decoding) decoder device. Using an ideal channel model and Turbo Product Code (TPC) with a code rate of 0.94 and iterating 10 times in both the Full-Trellis SISO and the two-Trellis SISO embodiments, the signal-to-noise loss of the instant invention relative to the Full-Trellis implementation was only 1 dB in the fall-off (waterfall) area.

Generally, the column and row codes of the transmission represent single-bit parity-check codes. A codeword can be expressed as a matrix of size 33 by 33, and four codewords constitute a single sector of user information.

Figure 4:
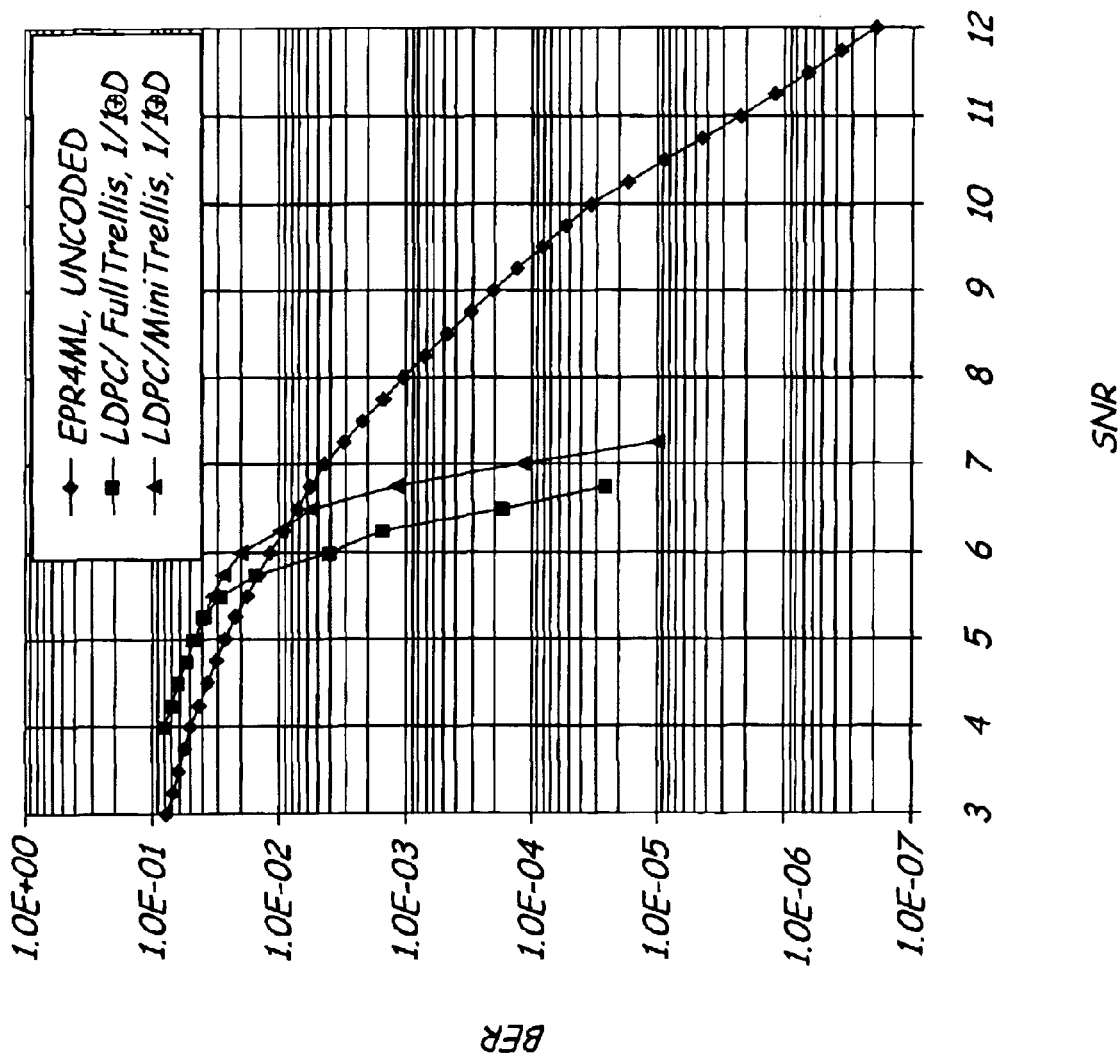
FIG. 4 is a graph of BER vs. SNR for a mini-Trellis implementation of the system of FIG. 2 having a $1/(1 \oplus D)$ factorization for the second SISO device applied to a LDPC code.

In FIG. 4, the two-trellis SISO decoder of the instant invention is compared to an eight-state SISO and an uncoded EPR4ML device using an LDPC code as the TURBO code. The LDPC code has a parity check matrix of column weight 3. All other simulation settings were the same as in FIG. 3. Though SISO device 40 has only two-state-trellis, the SNR loss was only about a half dB, providing an excellent compromise between complexity and performance.

Figure 5:
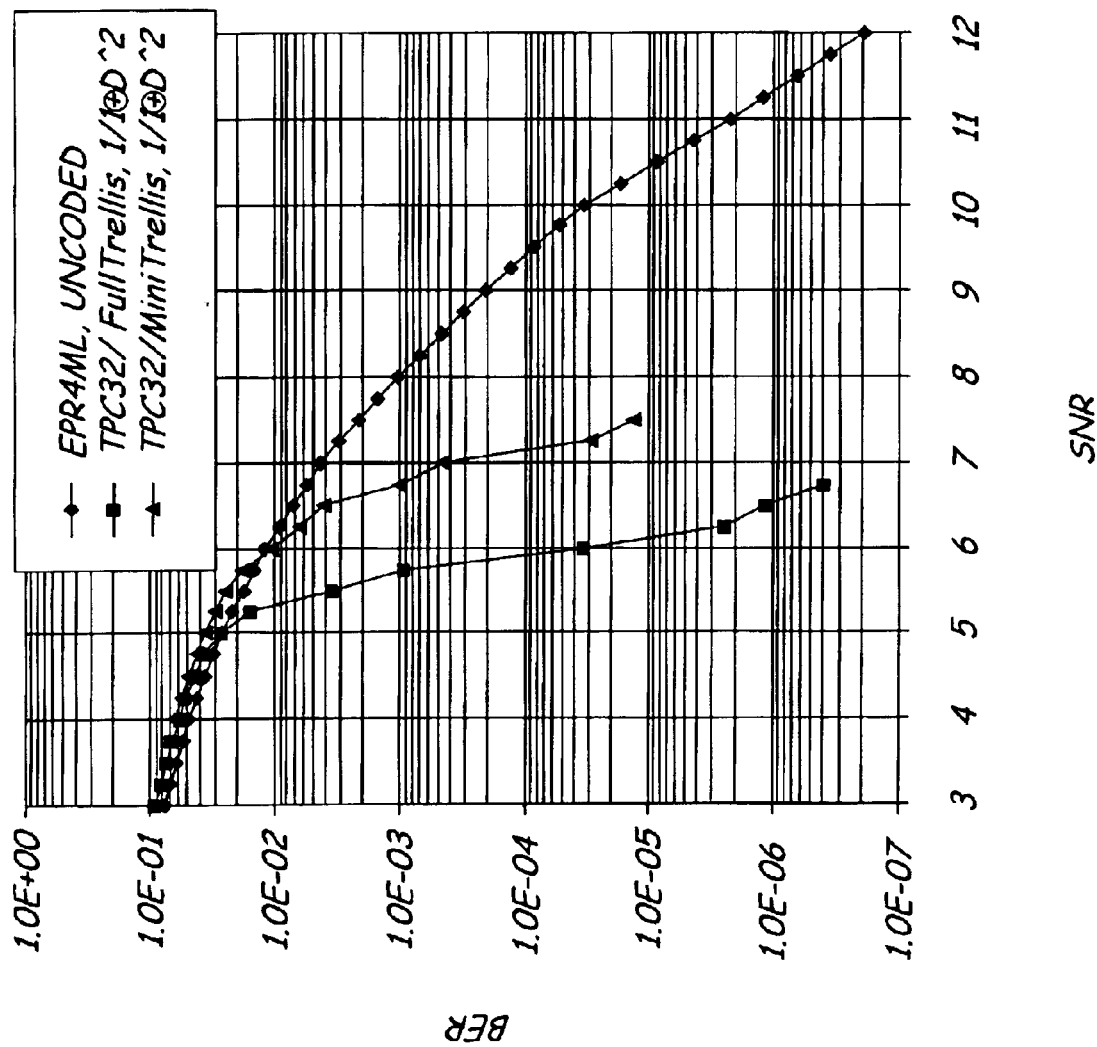
FIG. 5 is a graph of BER vs. SNR for a mini-Trellis implementation of the system of FIG. 2 having a $1/(1 \oplus D)^2$ factorization for the second SISO device applied to a TPC code.
Figure 6:
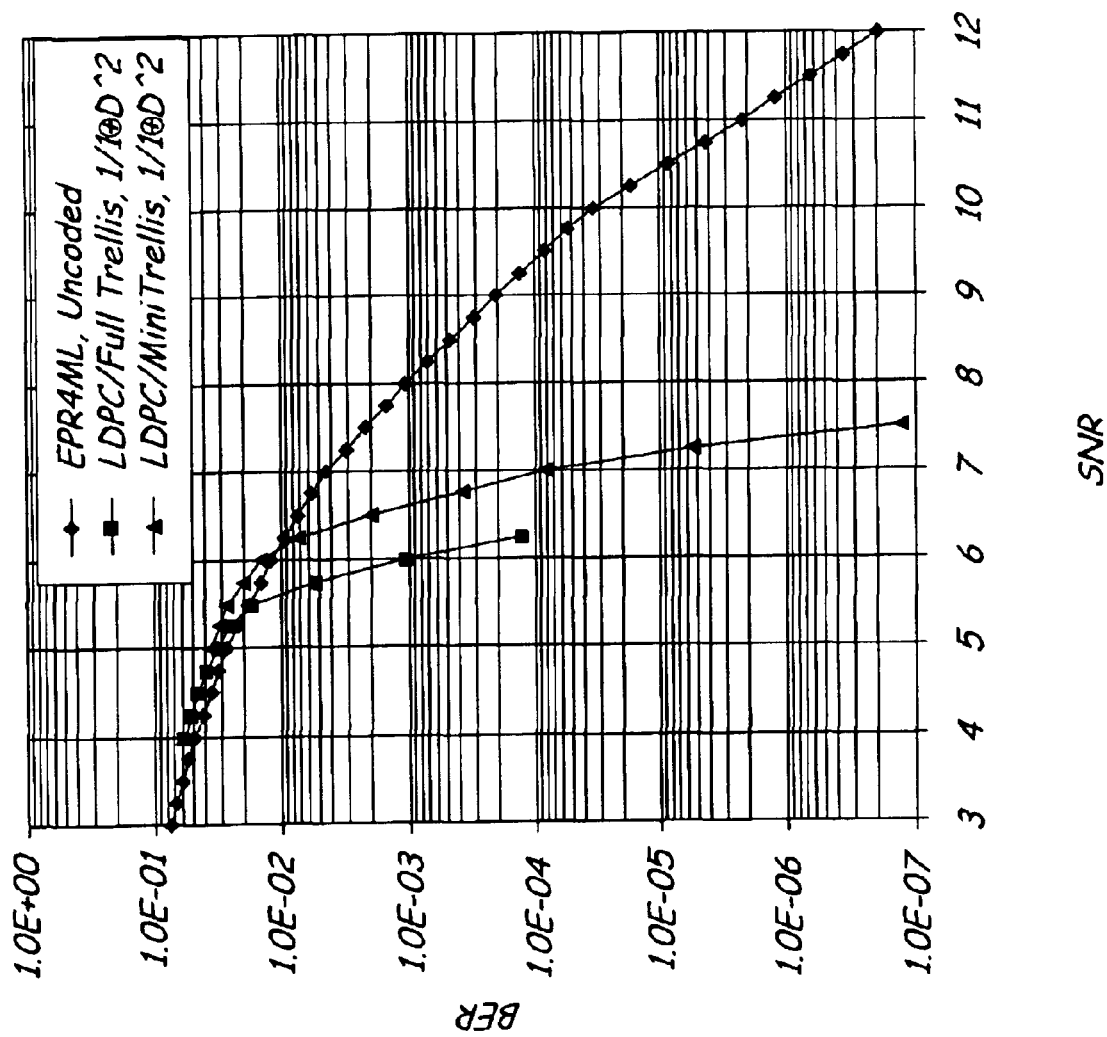
FIG. 6 is a graph of BER vs. SNR for a mini-Trellis implementation of the system of FIG. 2 having a $1/(1 \oplus D)^2$ factorization for the second SISO device applied to a LDPC code.

FIGS. 5 and 6 illustrate a different channel/precode mathematical model and factorization for the decoding circuit 36 as applied to a Turbo Product code (TPC) and an LDPC code. The mathematical model is as follows:

$$F_1(D) * F_2(D) = \frac{(1 + D - D^2 - D^3)}{(1 \oplus D)^2}$$

In this instance, the SISO device 29 was the same as in FIGS. 3 and 4. However, the SISO device 40 had the following implementation:

$$\frac{1}{(1 \oplus D)}$$

As before, the SISO device 29 had an eight-state-trellis, but SISO device 40 had a four-state trellis. As shown in FIG. 5, applying this 8/4-state trellis implementation to a Turbo Product Code (TPC) and using the same settings as in FIG. 3, the bit error rate of the 8/4-state trellis system is slightly larger than the 8/2-state trellis error shown in FIG. 3.

In FIG. 6, the same LDPC code as in FIG. 4 was applied to the 8/4-state trellis SISO system. All other simulation settings were the same as in FIG. 3. In this instance, the SNR loss was again less than 1 dB.

If the instant invention is applied to a ternary input trellis structure, the resulting simplification for the turbo-decoding circuit is again significant. In this instance, the impulse response is {1, 1, -1, -1} and the precoder is 1/(1⊕D). The channel/precoder mathematical model is based on the following convolution:

$$F_1(D) * F_2(D) = \frac{(1 - D)^2(1 + D)}{(1 \oplus D)}$$

where $$F_1(D) = (1 - D)^2$$

and $$F_2(D) = \frac{1 + D}{(1 \oplus D)}$$

The SISO device 29 may have the same eight-state trellis structure as in the previous discussion or it may have an entirely different state-trellis structure, depending on the particular factorization of the precoder and channel. For simplicity, in the previous tables, the SISO device 29 has been presented as having an eight-state trellis structure; however, in practice, the SISO device 29 is likely to be more complex. Almost any configuration of SISO devices is achievable. Specifically, the state trellis for any SISO device is determined by the alphabet it takes and the maximum length of the channel memory. If the trellis takes a binary alphabet, then the number of states is determined by $2^n$. However, if the alphabet is ternary, the number of states is $3^n$. Thus, to achieve a nine-state trellis, the maximum channel length for a trellis that takes a three letter alphabet would be two (2). The following table illustrates a SISO device 29 having a ternary alphabet.

TABLE 3

Ternary trellis structure.

| before/after | 0 | 1 | 2 | 3 | 4 | 5 | 6 | 7 | 8 |
|---|---|---|---|---|---|---|---|---|---|
| 0 |  | -2/0 | 0/2 | 2/4 |  |  |  |  |  |
| 1 |  |  |  | -2/0 | 0/2 | 2/4 |  |  |  |
| 2 |  |  |  |  |  | -2/0 | 0/2 | 2/4 |  |
| 3 | -2/-2 | 0/0 | 2/2 |  |  |  |  |  |  |
| 4 |  |  | -2/-2 | 0/0 | 2/2 |  |  |  |  |
| 5 |  |  |  |  | -2/-2 | 0/0 | 2/2 |  |  |
| 6 | -2/-4 | 0/-2 | 2/0 |  |  |  |  |  |  |
| 7 |  |  | -2/-4 | 0/-2 | 2/0 |  |  |  |  |
| 8 |  |  |  |  | -2/-4 | 0/-2 | 2/0 |  |  |

In this instance, the trellis structure of SISO device 29 has nine states, since each input has three possible values. The non-binary input of SISO device 29 increases the complexity of the implementation. However, by implementing the factorization of the instant invention, since the SISO device 29 is only processed once, the added complexity of the non-binary input is generally acceptable because the SISO device 29 does not unduly burden the decoder circuit 36.

The SISO device 29, as in previous examples, passes the value and probability vector to the SISO device 40, which has a two-state trellis. As shown in Table 4. Here, BPSK modulation is assumed after preceding, so that the output values are in the set $\{-2, 0, 2\}$.

TABLE 4

Two-state trellis structure following a ternary trellis structure of Table 3.

| before/after | 0 | 1 |
|---|---|---|
| 0 | 0/-2 | 1/0 |
| 1 | 1/0 | 0/2 |

As illustrated, though the ternary SISO device 29 has 9 states, the complexity of the first SISO is not amplified by the turbo loop, because SISO device 40 has a two state trellis. Thus, by factoring the mathematical model for the communication channel/precoder, the complexity of the SISO device 40 within the turbo loop can be minimized with an acceptable bit error rate.

By locating the simpler SISO device 40 within the turbo loop, the complexity of the system is reduced significantly as the number of turbo iterations increases. If the turbo loop is implemented in a parallel circuit architecture, the reduction in chip area used by the turbo loop can be significant. Alternatively, if the turbo loop is implemented serially, the reduction in processing time can be very large. While the reduction in complexity results in some performance degradation in terms of errors, the performance loss is acceptable in many cases, providing a good compromise between complexity and performance.

Figure 7:
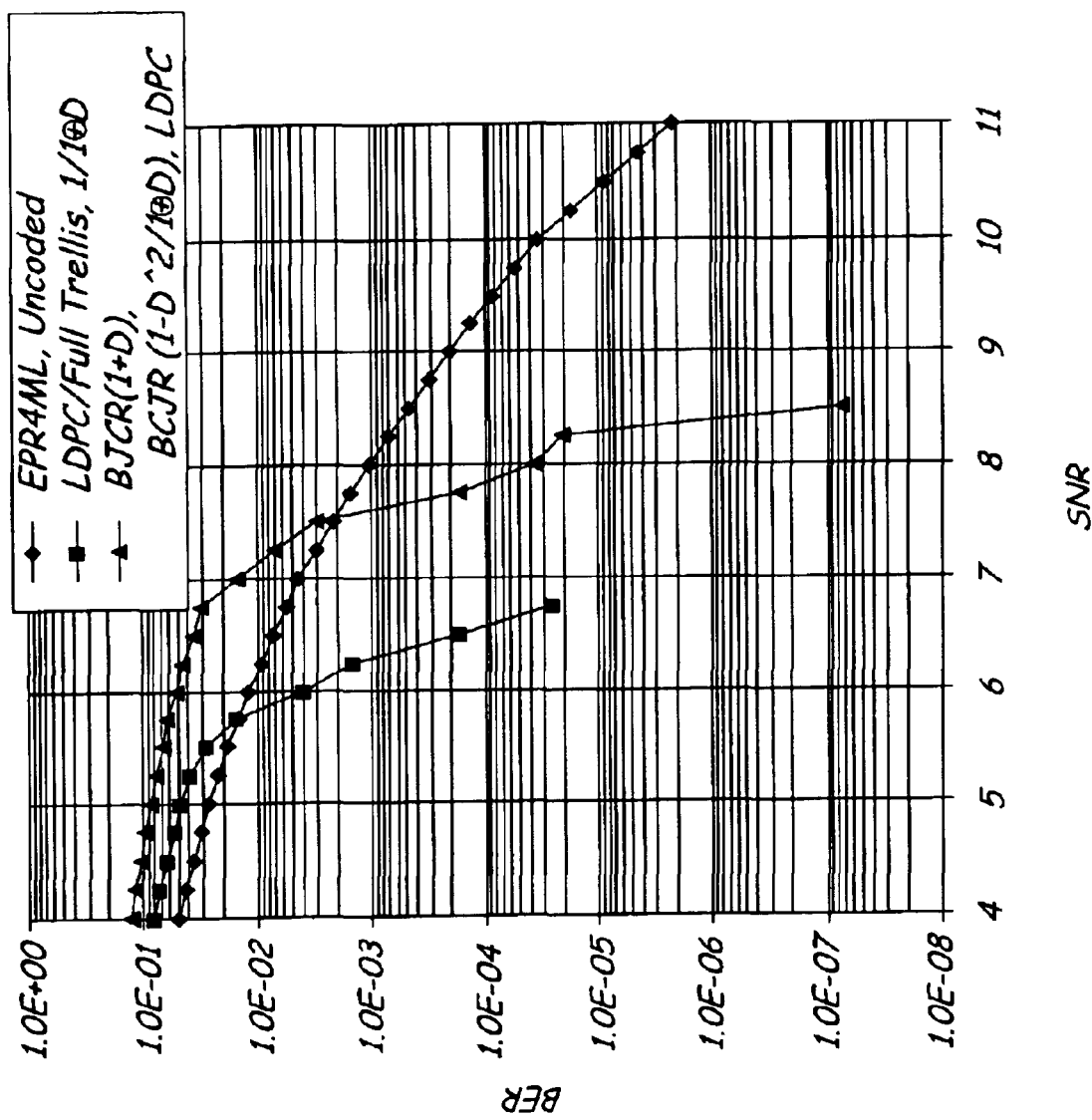
FIG. 7 is a graph of BER vs. SNR for a mini-Trellis implementation of the system of FIG. 2 having a different factorization.

FIG. 7 illustrates the BER versus SNR for an LDPC code used as a Turbo code (same as used in FIG. 4). Here, the mathematical model for the communication channel/precoder is as follows:

$$F_1(D) * F_2(D) = \frac{(1+D)(1-D)^2}{(1 \oplus D)}$$

In this instance, the model is factored such that SISO device 40 is a four-state device. As shown in FIG. 7, this factorization results in an SNR loss of over 1 dB.

While the present invention has been described as a factorization involving two SISO devices, the specific coded signal may be more efficiently decoded by three or more SISO devices, interconnected such that one of the simpler SISO devices is positioned within the TURBO loop. By arranging the simplest SISO device within the turbo decoder loop, the complexity of the turbo loop of the system is minimized. By adjusting the configuration such that a simpler SISO device (but not necessarily the simplest SISO device) is positioned within the Turbo loop, the complexity of the turbo loop may be simplified (relative to the conventional systems) while achieving a different bit-error rate. In other words, in some instances it may be possible to adjust the factorization to improve the bit-error-rate, while increasing the complexity of the decoder only slightly, by placing a simpler SISO device inside the turbo loop that is not the simplest possible state trellis. Thus, in some instances, more states can be accounted for during soft decision-making within the turbo loop, thereby improving the bit error rate.

By simplifying the state-trellis structure of each SISO and by placing one of the simpler SISO devices within the loop, the chip area used by the turbo decoder loop can remain relatively small. Specifically, the entire state-trellis of the SISO within the loop must be provided for in the chip circuit for each iteration. Thus, the larger the state-trellis within the iterative loop, the more complex the circuit must be. By splitting the factorization into simpler subsets, a simpler SISO with a simpler state-trellis structure can be implemented inside the turbo loop, thereby minimizing the circuit footprint.

While the present invention has been described with respect to a communication channel, it should be understood that communication channel can refer to a transmission medium, such as an analog telephone circuit, a digital circuit (such as a Digitial Subscriber Line, and the like), Ethernet, and other similar transmission mediums. The present invention also applies to coding through wireless, cellular, digital PCS, or any other wireless transmission medium. Finally, the phrase communication channel also refers to stored mediums, such as magnetic discs, and the like. Thus, the instant invention is applicable, not only to inter-device transmissions, but also intra-device transmissions (such as between the MR head of a disc drive and the spinning disc of the hard drive of a computer).

Although the present invention has been described with reference to preferred embodiments, workers skilled in the art will recognize that changes may be made in form and detail without departing from the spirit and scope of the invention.

What is claimed is:

1. A method for iterative decoding comprising:
    generating an output based on a received coded signal using a first soft-input soft-output device based on a first trellis structure; and providing the output of the first soft-input soft-output device solely to an input of a second soft-input soft-output device based on a second trellis structure, the second soft-input soft-output device further having an output which is coupled to an input of an iterating decoder which in turn has an output thereof coupled to an input of the second soft-input soft-output device to form a decoding loop, the second trellis structure representing fewer possible device states than the first trellis structure.

2. The method of claim 1 further comprising:

receiving the coded signal from an information transmission medium, including a communication channel, that is coupled to an input of the first soft-input soft-output device for the generating of a decoded output signal.

3. The method of claim 2, wherein the communication channel includes a hard drive magnetic disc.

4. The method of claim 1, wherein the first and second soft-input soft-output devices are suited for decoding components of the coded signal corresponding to selected portions of an information transmission medium based on the first trellis structure and the second trellis structure, respectively, the selected portions of the information transmission medium being combined to form the information transmission medium which extends to the first soft-input soft-output device and includes therein at least a communication channel and a precoder.

5. The method of operating a turbo decoding circuit for decoding a received signal from an information transmission medium, including a communication channel having combined therein at least two selected portions for providing components of the received signal suited for decoding by corresponding first and second SISO devices based on corresponding first and second trellis structures, respectively, such that together the first and second SISO devices are suited for decoding the entire received signal, the method comprising:

processing the received signal with a first SISO device having the first trellis structure corresponding to one of the portions;

processing outputs of the first SISO device with one or more secondary SISO devices with a secondary SISO device receiving outputs of the first SISO device having the second trellis structure corresponding to another of the portion, the first trellis structure having fewer possible states than the second trellis structure; and iteratively decoding outputs of the secondary SISO devices.

6. The method of claim 5, wherein the step of processing the received signal comprises:

inputting the received signal into the first SISO device; and generating from the first SISO device a soft-output corresponding to the received signal.

7. The method of claim 5, wherein the step of processing an output of the first SISO device comprises:

inputting outputs of the first SISO device into a secondary SISO device; and generating soft-outputs based on outputs of the first SISO device.

8. The method of claim 5, wherein iteratively decoding comprises:

rendering soft-outputs in one of four states based the output received from the first SISO device.

9. The method of claim 5, wherein iteratively decoding comprises:

inputting soft-outputs of a secondary SISO device into a de-interleaver; and passing the de-interleaved soft-outputs to a decoder.

10. The method of claim 9, wherein iteratively decoding further comprises:

subtracting de-interleaved soft-outputs of a secondary SISO device from outputs of the decoder to form difference values;

interleaving the difference values;

inputting the interleaved difference values into one or more secondary SISO devices as secondary inputs; and subtracting the interleaved difference values from the soft-outputs of a secondary SISO device.

11. An apparatus for turbo decoding coded information received from an information transmission medium including a communication channel, the apparatus comprising:

a first soft-input soft-output device based on a first trellis structure, the first soft-input soft-output device for receiving the coded information at an input thereof; and a decoder loop having therein at least a second soft-input soft-output device based on a second trellis structure with an output of the second soft-input soft-output device coupled to an input of an iterating decoder also in the decoder loop having in turn an output thereof coupled to an input of the second soft-input soft-output device, the decoder loop for receiving an output signal from an output of the first soft-input soft-output device solely at an input of the second soft-input soft-output device and for iteratively generating with the second soft-input soft-output device and the iterating decoder output values at a device therein representative of the received coded information, the first trellis structure having more possible device states than the second trellis structure.

12. The apparatus of claim 11 wherein the decoder loop further comprises:

a de-interleaver coupling the output of the second soft-input soft-output device to the input of the iterating decoder; and an interleaver coupling the output of the iterating decoder to the input of the second soft-input soft-output device.

13. The apparatus of claim 11 wherein the communication channel includes a magnetic disc track in a hard disc drive.

14. The apparatus of claim 11 wherein the decoder loop is implemented in a parallel architecture in a circuit.

15. An apparatus for turbo decoding information in a coded signal received from an information transmission medium including a communication channel comprising:

a first SISO device based on a first trellis structure, the first SISO device for receiving the coded signal and for generating output bits and reliability bits corresponding to the coded signal; and a turbo decoder loop having a plurality of SISO devices each having an output coupled to an input of another and each based on a corresponding loop device trellis structure at least one of which differs from the first trellis structure, the plurality of SISO devices including a decoder device and a second SISO device for receiving the output bits and the reliability bits and having a corresponding loop second SISO trellis structure having fewer possible states than the first trellis structure, the decoder loop for iteratively generating a decoded output signal at the decoder device therein corresponding to the coded signal, the information transmission medium having combined therein at least two selected portions for providing components of the coded signal suited for decoding correspondingly by the first and second SISO devices based on the first trellis structure and the loop second SISO trellis structure, respectively, such that together the first and second SISO devices are suited for decoding the entire coded signal.

16. The apparatus of claim 15 wherein the turbo decoder further comprises:

an interleaver coupling an output of one of the plurality of SISO devices to an input of another; and a de-interleaver coupling an output of one of the plurality of SISO devices to an input of another.

17. The apparatus of claim 15 wherein the coded signal received is based on information that has been previously stored in a magnetic recording medium.

18. The apparatus of claim 15 wherein the first trellis structure characterizing the first SISO device is based on a chosen alphabet and a channel memory length.

19. The apparatus of claim 15 wherein the decoder loop is implemented in a parallel architecture in a circuit.

20. The apparatus of claim 15 wherein the information transmission medium is coupled to the first SISO device for transmitting the coded signal thereto and the communications channel includes a hard drive magnetic disc.

* * * * *